(12) United States Patent
Chen et al.

(10) Patent No.: US 9,401,457 B2
(45) Date of Patent: Jul. 26, 2016

(54) METHOD FOR FORMING CURRENT DIFFUSION LAYER IN LIGHT EMITTING DIODE DEVICE AND METHOD FOR FABRICATING THE SAME

(71) Applicant: BYD Company Limited, Shenzhen (CN)

(72) Inventors: Wanshi Chen, Shenzhen (CN); Wang Zhang, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 0 days.

(21) Appl. No.: 14/101,210

(22) Filed: Dec. 9, 2013

(65) Prior Publication Data
US 2014/0091355 A1 Apr. 3, 2014

Related U.S. Application Data

(63) Continuation of application No. PCT/CN2012/077035, filed on Jun. 15, 2012.

(30) Foreign Application Priority Data

Jun. 17, 2011 (CN) .......................... 2011 1 0163904

(51) Int. Cl.
*H01L 21/76* (2006.01)
*H01L 21/00* (2006.01)
(Continued)

(52) U.S. Cl.
CPC .............. *H01L 33/42* (2013.01); *C23C 14/086* (2013.01); *C23C 14/30* (2013.01);
(Continued)

(58) Field of Classification Search
CPC C23C 14/086; C23C 14/30; H01L 21/02002; H01L 21/02293; H01L 21/20; H01L 21/2022; H01L 21/36; H01L 2224/94; H01L 2251/308; H01L 24/94; H01L 27/14687; H01L 2933/0016; H01L 31/022466; H01L 31/022475; H01L 31/022483; H01L 31/1884; H01L 33/22; H01L 33/42; H01L 51/442; H01L 51/4233; H01L 21/02104
USPC ................. 257/43, 81, 98, 99, 431, 432, 620, 257/E31.126, E33.005, E33.064, E21.461; 438/22, 416, 607, 608, 641, 674
See application file for complete search history.

(56) References Cited

U.S. PATENT DOCUMENTS 3,204,143 A * 8/1965 Pritchard ........................ 315/14
3,331,983 A * 7/1967 Hesse ........................ 315/12.1
(Continued)

FOREIGN PATENT DOCUMENTS

CN 101075652 A 11/2007
CN 101740704 A 6/2010
(Continued)

OTHER PUBLICATIONS

"Electrical, Optical and Material Properties of ZnO-Doped Indium—Tin Oxide Films Prepared Using Radio Frequency Magnetron Cosputtering System at Room Temperature", Liu, Day-Shan et al., Japanese Journal of Applied Physics, vol. 45, No. 4B, 2006, pp. 3526-3530.*

(Continued)

*Primary Examiner* — Teresa M Arroyo
(74) *Attorney, Agent, or Firm* — Alston & Bird LLP

(57) ABSTRACT

A method of forming a current diffusion layer is provided that comprises providing an epitaxial wafer. The method further comprises depositing ITO source material on the epitaxial wafer to form a base ITO layer by a direct current electron gun and depositing ZnO source material, during simultaneous deposition of the ITO source material, on the base ITO layer to form a ZnO doped ITO layer by a pulse current electron gun. The ZnO source material is deposited at a deposition rate higher than the rate at which the ITO source material is deposited. Generation and termination of current may be controlled by adjusting a duty cycle of pulse current provided by the pulse current electron gun and result in discontinuous deposition of the ZnO source material. The method further comprises depositing the ITO source material on the ZnO doped ITO layer to cover the ZnO doped ITO layer and form a finished ITO layer.

14 Claims, 8 Drawing Sheets

(51) Int. Cl.
  *H01L 21/44* (2006.01)
  *H01L 21/4763* (2006.01)
  *H01L 33/42* (2010.01)
  *C23C 14/30* (2006.01)
  *C23C 14/08* (2006.01)
  *H01L 31/0224* (2006.01)
  *H01L 21/02* (2006.01)
  *H01L 33/22* (2010.01)

(52) U.S. Cl.
  CPC .. *H01L 21/02104* (2013.01); *H01L 31/022466* (2013.01); *H01L 31/022475* (2013.01); *H01L 31/022483* (2013.01); *H01L 33/22* (2013.01); *H01L 2251/308* (2013.01); *H01L 2933/0016* (2013.01)

(56) References Cited

U.S. PATENT DOCUMENTS

| | | | | |
|---|---|---|---|---|
| 5,009,922 | A * | 4/1991 | Harano et al. | 427/571 |
| 5,300,788 | A * | 4/1994 | Fan et al. | 257/13 |
| 6,498,358 | B1 * | 12/2002 | Lach et al. | 257/183 |
| 2003/0022414 | A1 * | 1/2003 | Lian et al. | 438/80 |
| 2005/0001224 | A1 * | 1/2005 | Chen | 257/98 |
| 2005/0006652 | A1 * | 1/2005 | Pai | 257/79 |
| 2005/0067623 | A1 * | 3/2005 | Ha et al. | 257/79 |
| 2005/0104080 | A1 * | 5/2005 | Ichihara et al. | 257/98 |
| 2005/0148194 | A1 * | 7/2005 | Lan et al. | 438/706 |
| 2005/0277218 | A1 * | 12/2005 | Nakajo et al. | 438/46 |
| 2006/0175624 | A1 * | 8/2006 | Sharma et al. | 257/94 |
| 2006/0243988 | A1 * | 11/2006 | Narukawa et al. | 257/79 |
| 2007/0065959 | A1 * | 3/2007 | Chang et al. | 438/31 |
| 2007/0069225 | A1 * | 3/2007 | Krames et al. | 257/94 |
| 2009/0230407 | A1 * | 9/2009 | Fan et al. | 257/79 |
| 2010/0123166 | A1 | 5/2010 | Bae | |

FOREIGN PATENT DOCUMENTS

| | | |
|---|---|---|
| CN | 101931034 A | 12/2010 |
| CN | 101964382 A | 2/2011 |
| JP | 2001203393 A | 7/2001 |
| JP | 2005217331 A | 8/2005 |
| JP | 2011060986 A | 3/2011 |

OTHER PUBLICATIONS

"The effect of annealing and ZnO dopant on the optoelectronic properties of ITO thin films", Mohamed, H.A., J. Phys. D: Appl. Phys. 40 (2007) 4234-4240.*

Extended European Search Report as issued in corresponding European Application No. 12800673.1, dated Oct. 10, 2014.

International Search Report as issued in corresponding International Application No. PCT/CN2012/077035, dated Sep. 20, 2012.

Zhan, P., et al., Preparation of Highly Textured ZnO Thin Films by Pulsed Electron Deposition, *Materials Transactions*, 2011, pp. 1764-1767, vol. 52(9).

* cited by examiner

US 9,401,457 B2

METHOD FOR FORMING CURRENT DIFFUSION LAYER IN LIGHT EMITTING DIODE DEVICE AND METHOD FOR FABRICATING THE SAME

CROSS-REFERENCE TO RELATED APPLICATION

This application is a continuation of PCT/CN2012/077035, which claims priority to Chinese Patent Application Serial No. 201110163904.2, filed with the State Intellectual Property Office of P. R. China on Jun. 17, 2011, the entire content each of which are incorporated herein by reference in their entireties.

FIELD

The present disclosure generally relates to a semiconductor device and method. More particularly, the invention relates to a light emitting diode device and method for manufacturing a light emitting diode device and a method for fabricating the light emitting diode device.

BACKGROUND

ITO (indium-tin oxide) has been widely used as a current diffusion layer in fabrication of an LED (light emitting diode) device. To achieve a light extraction efficiency enhancement, a commonly used method is to roughen the surface of an ITO layer. In the prior art, the method for roughening the surface of the ITO layer mainly comprises a dry etching method and a wet etching method. A dry etching method may comprise steps of forming the ITO layer, forming a pattern using a photoresist, and etching an ITO region which is not protected by the photoresist using ICP (inductive couple plasmas), so as to roughen the surface of the ITO layer. A wet etching method may comprise steps of coating a layer of nanoparticles on at least a portion of surface of the ITO layer as a protective layer and etching a region which is not covered by the nanoparticles using a corrosion solution, such as an acid solution, so as to roughen the surface of the ITO layer.

BRIEF SUMMARY

According to one exemplary embodiment of the subject disclosure, a method is described. The method comprises providing an epitaxial wafer. The method further comprises depositing ITO source material on the epitaxial wafer to form a base ITO layer by a direct current electron gun and depositing ZnO source material, during simultaneous deposition of the ITO source material, on the base ITO layer to form a ZnO doped ITO layer by a pulse current electron gun. The ZnO source material may be deposited at a deposition rate higher than the rate at which the ITO source material is deposited. Generation and termination of current may be controlled by adjusting a duty cycle of pulse current provided by the pulse current electron gun and result in discontinuous deposition of the ZnO source material. The method further comprises depositing the ITO source material on the ZnO doped ITO layer to cover the ZnO doped ITO layer and form a finished ITO layer.

According to another exemplary embodiment of the subject disclosure, a method is described. The method comprises providing a current diffusion layer, forming a photoresist protective layer on the finished ITO layer to cover a step region, removing the finished ITO layer and the ZnO doped ITO layer from a mesa region, removing the photoresist protective layer, and depositing conductive material on the surface of the cover ITO layer in the step region to form a positive electrode and on the surface of the n-type nitride layer in the mesa region to form a negative electrode.

BRIEF DESCRIPTION OF THE DRAWINGS

These and other aspects and advantages of embodiments of the present disclosure will become apparent and more readily appreciated from the following descriptions made with reference to the accompanying drawings, in which.

DETAILED DESCRIPTION

Figure 1:
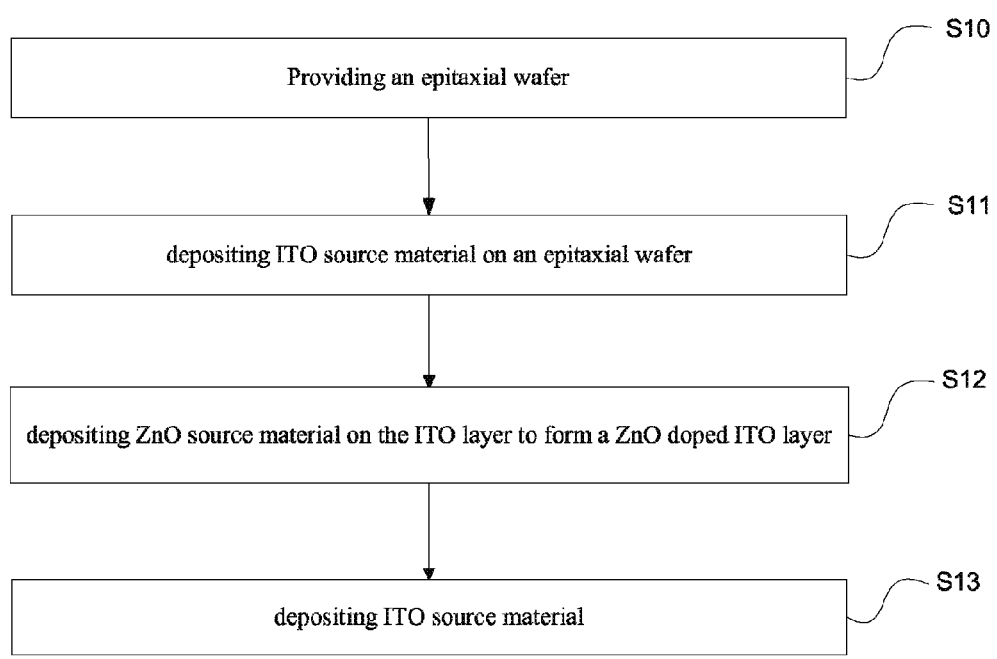
FIG. 1 illustrates a flow chart of forming a current diffusion layer according to exemplary embodiments of the disclosure.

Reference will be made in detail to embodiments of the present disclosure. The embodiments described herein with reference to drawings are explanatory, illustrative, and used to generally understand the present disclosure. The embodiments shall not be construed to limit the present disclosure or claims thereto. The same or similar elements and the elements having same or similar functions are denoted by like reference numerals throughout the descriptions.

Figure 2:
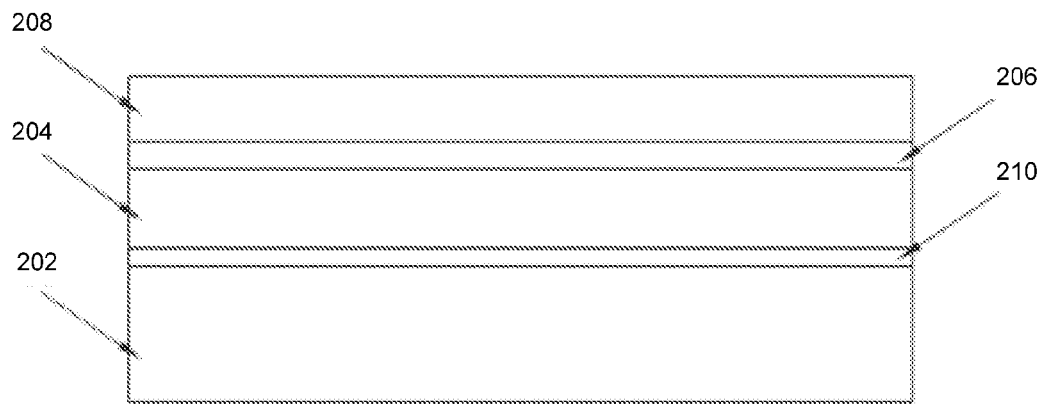
FIG. 2 illustrates a cross-sectional view of an epitaxial wafer.

FIG. 1 is a flow chart of a method 100 for forming a current diffusion layer according to an embodiment of the present disclosure. FIG. 2 illustrates a cross-sectional view of an epitaxial wafer according to exemplary embodiments of the disclosure. With reference to FIGS. 1 and 2, an epitaxial wafer 200 may be provided at step S10. The epitaxial wafer 200 may comprise a substrate 202, an n-type nitride layer 204 formed on the substrate 202, a light emitting diode layer 206 formed on the n-type nitride layer 204, a p-type nitride layer 208 formed on the light emitting diode layer 206. An optional buffer layer 210 may be formed between the substrate 202 and the n-type nitride layer 204.

Figure 3A:
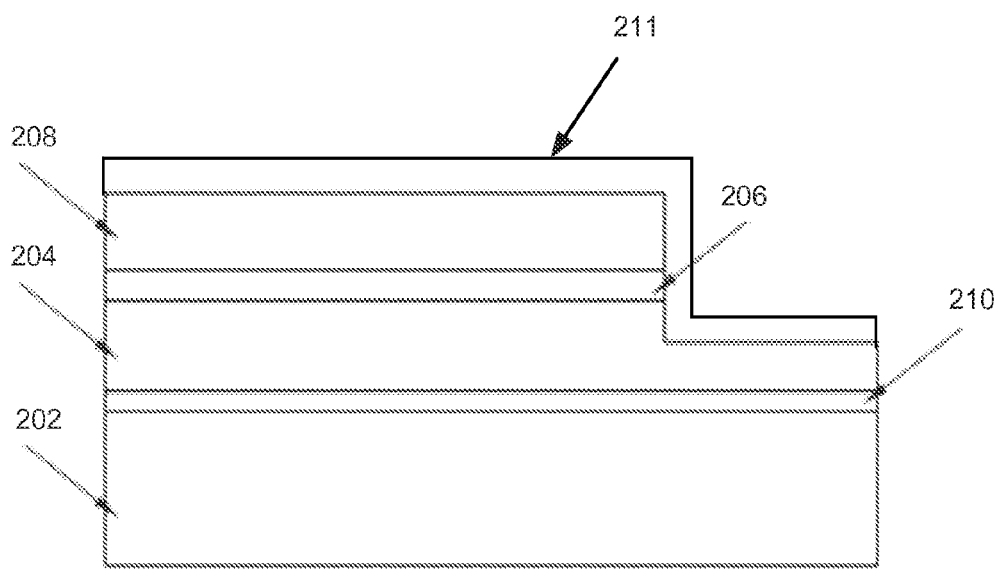
FIG. 3A illustrates a cross-sectional view of forming a photoresist protective layer on an epitaxial wafer according to exemplary embodiments of the disclosure.
Figure 3B:
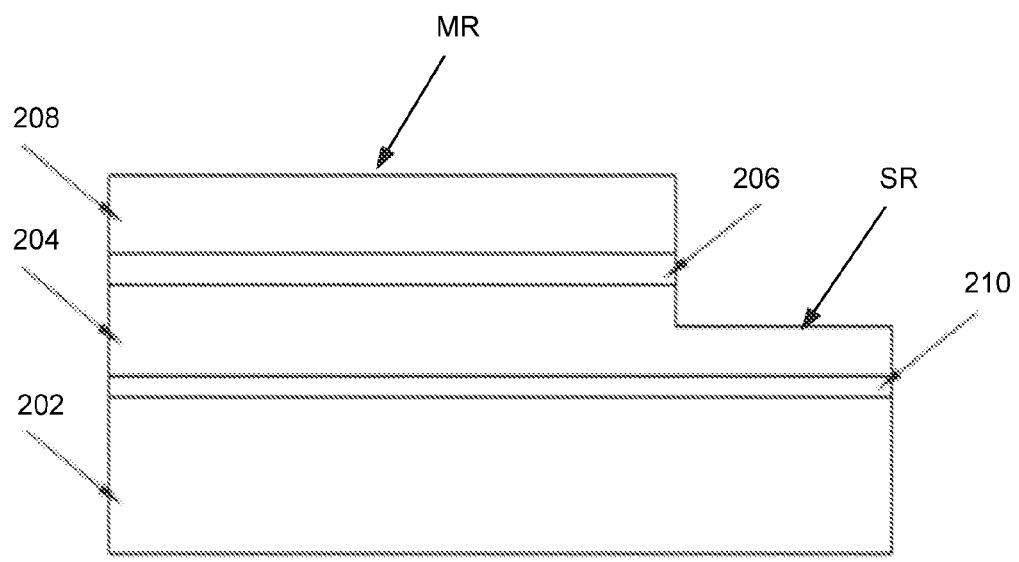
FIG. 3B illustrates a cross-sectional view of forming a mesa region and a step region on an epitaxial wafer according to exemplary embodiments of the disclosure.

A photoresist protective layer 211 having a pattern may be formed by applying a lithography process. The photoresist protective layer 211 may be applied to a surface of the p-type nitride layer 208, as shown in FIG. 3A. Inductive couple plasmas technique may be applied to selectively remove material of the p-type nitride layer 208, the light emitting diode layer 206, and the n-type nitride layer 204 to expose part of the n-type nitride layer 204. The photoresist protective layer 211 may then be removed using a photoresist stripping solution. As shown in FIG. 3B, a mesa region MR may be formed on the p-type nitride layer 208. A step region SR may then be formed on the n-type nitride layer 204.

Figure 4:
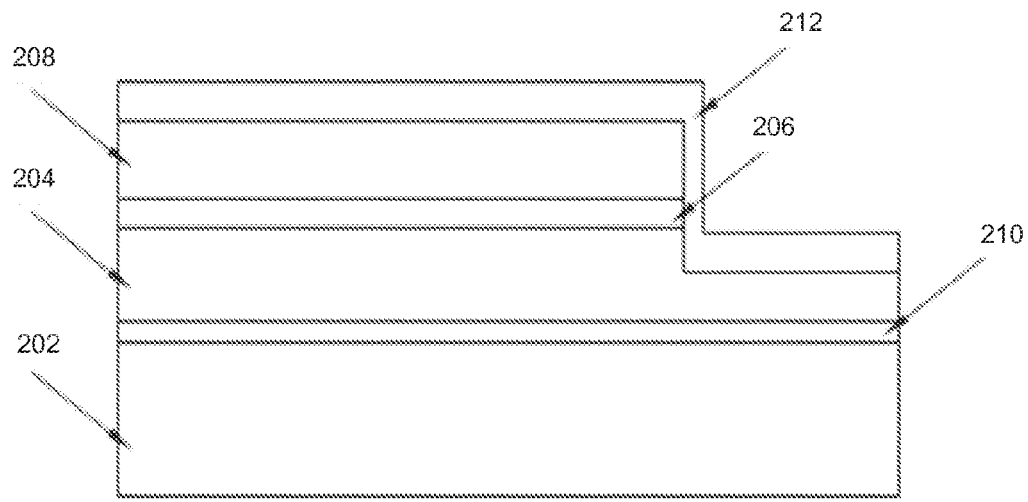
FIG. 4 illustrates a cross-sectional view of forming an ITO layer on top surface of an epitaxial wafer according to exemplary embodiments of the disclosure.

To form a current diffusion layer, ITO source material may be deposited on the epitaxial wafer 200, as shown in FIG. 4, such as using a physical vapor deposition method or a chemical vapor deposition, at step S11. In physical vapor deposition, ITO source material may be heated to cause the ITO source material undergo evaporation and deposited on the epitaxial wafer 200 by direct current electron gun. The physical vapor deposition method may be a cathodic arc deposition, electron beam physical vapor deposition, evaporative deposition, pulsed laser deposition, or sputter deposition.

During the deposition of the ITO source material, ZnO source material may be deposited, such as using a physical vapor deposition method, such as electron beam physical vapor deposition, at step S12. For convenience and brevity, the ITO layer formation prior to deposition of the ZnO is referred as base ITO layer 212. The ZnO source material and ITO source material may be deposited simultaneously using their respective deposition method resulting in dispersion of ZnO 214 in the base ITO layer. The deposition of ITO source material and ZnO source material may use the same method or different methods. ZnO source material may be deposited at a deposition rate higher than the deposition rate at which the ITO source material is deposited. As a result of the simultaneous deposition of ZnO source material and ITO source material, a ZnO doped ITO layer may be formed. In one embodiment, the ITO source material may be deposit at a rate of about 0.5 Å/s to about 1.2 Å/s. The ZnO source material may be deposited at a rate of about 20 Å/s to about 30 Å/s.

Figure 5:
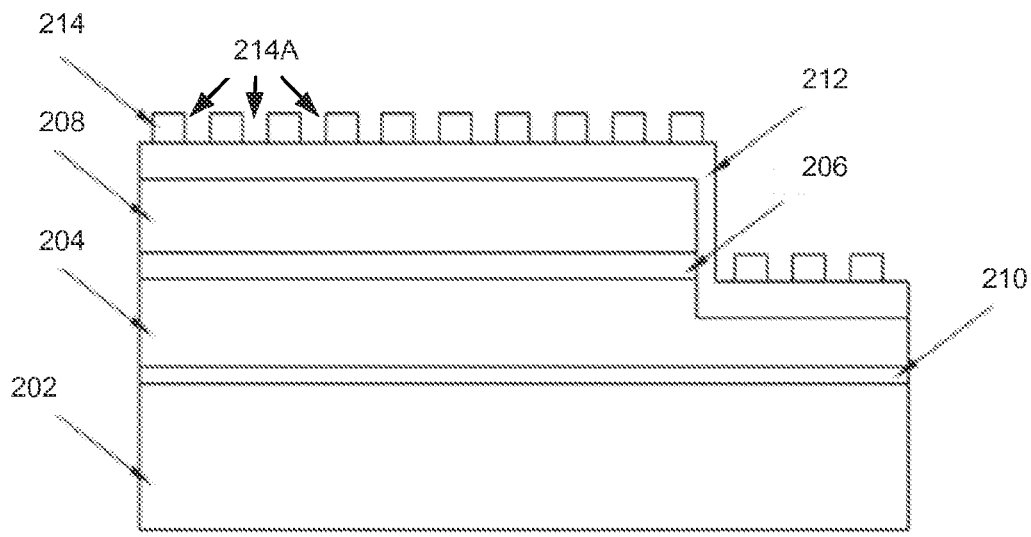
FIG. 5 illustrates a cross-sectional view of depositing ZnO source material onto the ITO layer to create a ZnO doped ITO layer according to exemplary embodiments of the disclosure.
Figure 6:
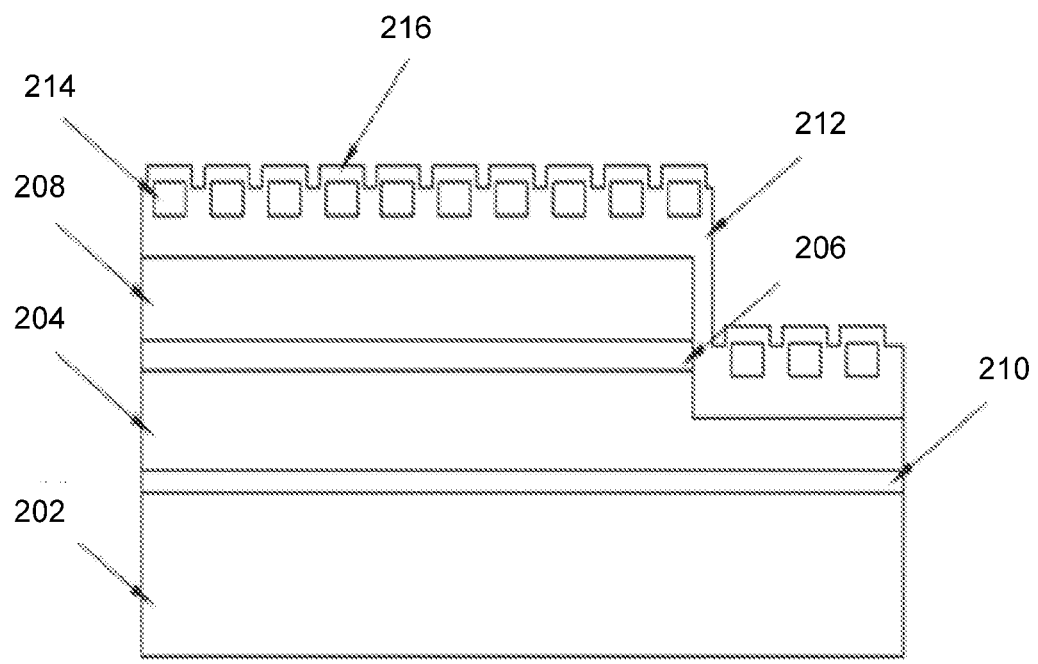
FIG. 6 illustrates a cross-sectional view of depositing ITO source material onto the ZnO doped ITO layer to create a current diffusion layer according to exemplary embodiments of the disclosure.

When electron beam physical vapor deposition method is used to deposit ZnO source material into the ITO layer, current generation and termination may be controlled by adjusting the pulse duty cycle of the beam current of the electron gun. In one embodiment, the duty cycle may be about 20%-30%. Current generation and termination may control deposition of the ZnO source material on the base ITO layer 212, thus resulting in discontinuous deposition. The discontinuous deposition may form a ZnO layer 214 on the base ITO layer 212 with an uneven surface. For example, the ZnO layer 214 may include a plurality of grooves such as grooves 214A, as shown in FIG. 5. The uneven surface of the ZnO layer 214 may result in roughness of the ZnO doped ITO layer. The ZnO doped ITO layer formation may comprise island growth. The ZnO doped ITO layer may be roughed using an in situ roughening method which may reduce production cost and production cycle. For example, when a dry etching method is used, a photoresist process may be skipped. Lithography equipment, ICP equipment, corrosion apparatus. and corrosion solution may not be used.

After deposition of ZnO source material concludes, ITO source material may continue to be heated and deposited at step S13 until the surface of the doped ZnO and the plurality of grooves (e.g., 214A) are covered by ITO source material. ITO source material that covers the doped ZnO may be about 10 nanometers to about 15 nanometers thick. For convenience and brevity, the ITO source material that covers the doped ZnO layer may be referred as cover ITO layer 216. The process of depositing ITO source material may form a finished ITO layer having a desired thickness of about 285 nanometers to about 290 nanometers. ZnO source material may be deposited when thickness of the base ITO layer reaches about 85%-90% of the desired thickness, such as when the thickness of the base ITO layer 212 is about 250 nanometers to about 260 nanometers.

Figure 7:
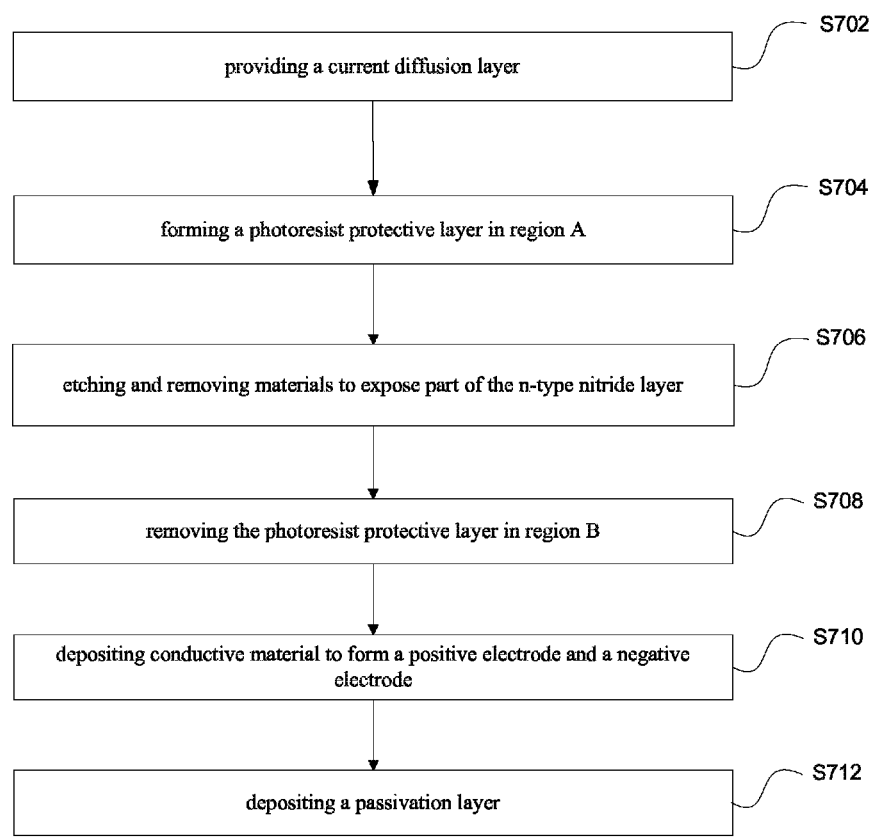
FIG. 7 illustrates a flow chart of a method for manufacturing a light emitting diode device according to exemplary embodiments of the disclosure.
Figure 8:
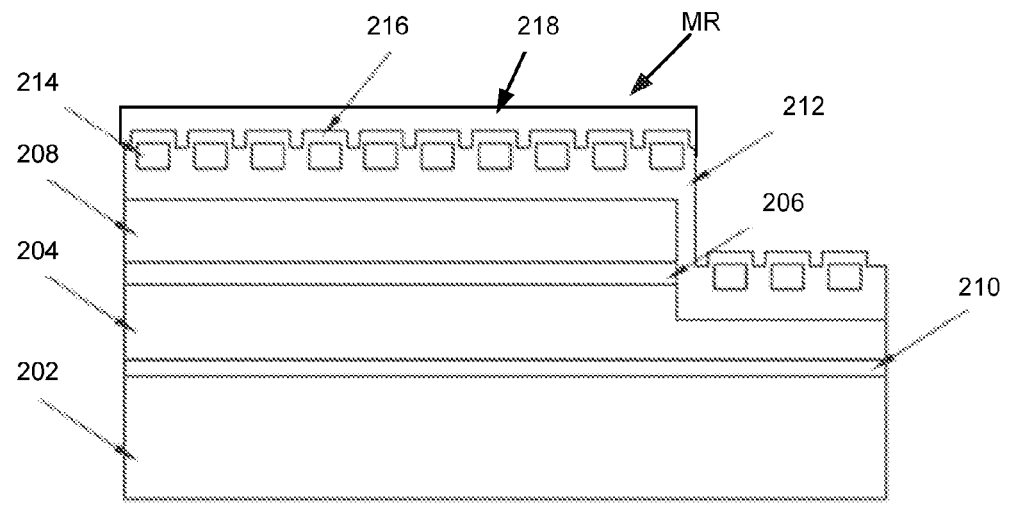
FIG. 8 illustrates a cross-sectional view of forming a photoresist protective layer on the ITO layer in mesa region according to exemplary embodiments of the disclosure.
Figure 9:
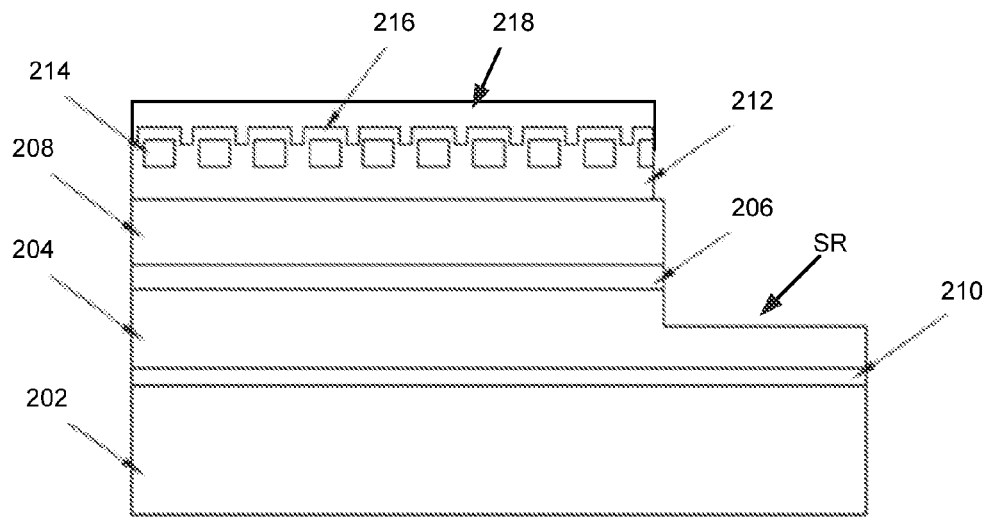
FIG. 9 illustrates a cross-sectional view of removing etching and removing materials to expose part of the n-type nitride layer according to exemplary embodiments of the disclosure.
Figure 10:
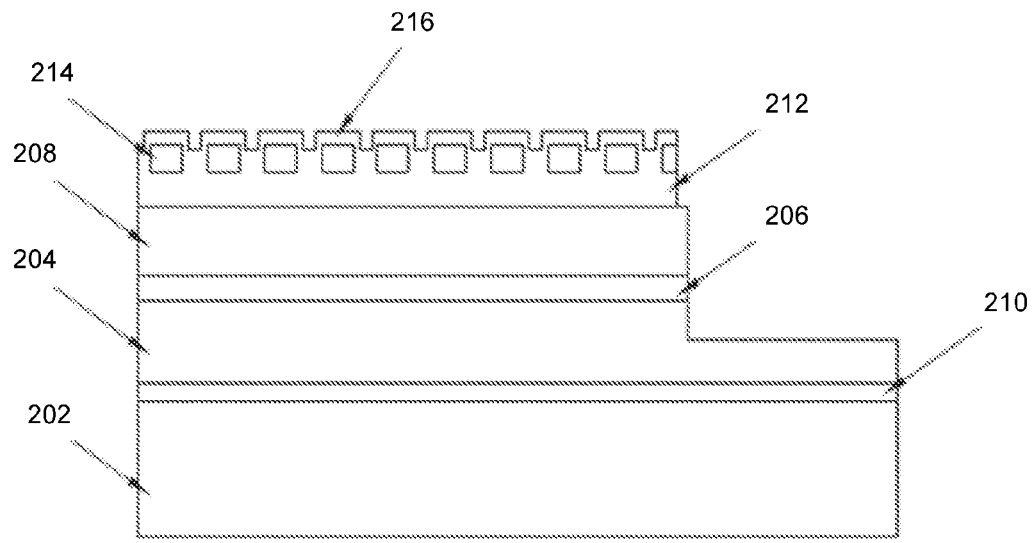
FIG. 10 illustrates a cross-sectional view of removing photoresist protective layer from the ITO layer in mesa region according to exemplary embodiments of the disclosure.
Figure 11:
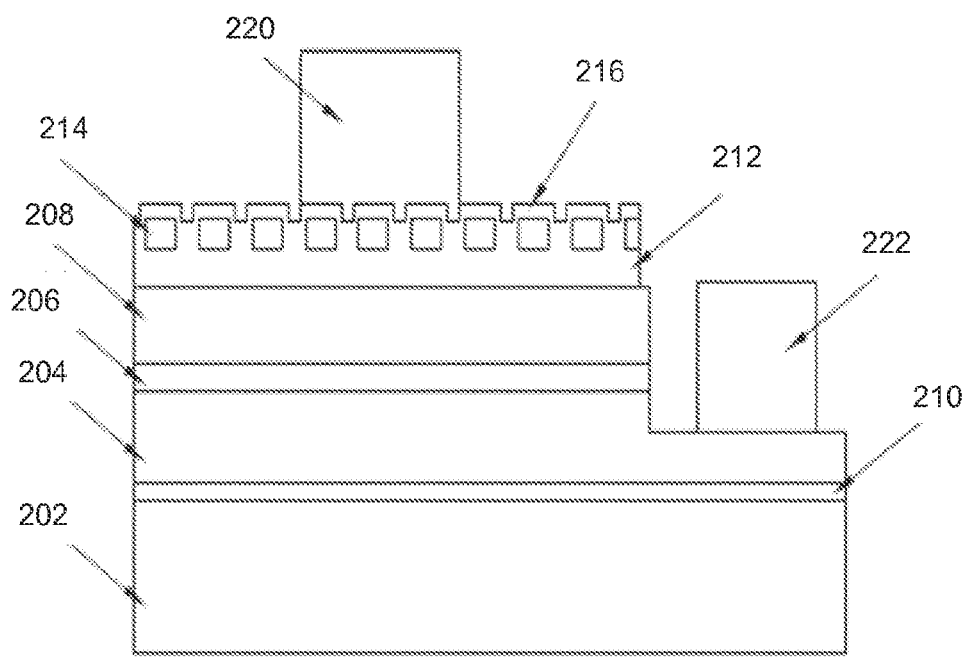
FIG. 11 illustrates a cross-sectional view of forming an anode and a cathode according to exemplary embodiments of the disclosure.

FIG. 7 illustrates a flow chart of a method 700 for manufacturing a light emitting diode according to exemplary embodiments of the disclosure. The method 700 may comprise providing a current diffusion layer at step S702. The current diffusion layer may be formed by the steps described in FIGS. 1-6. The method 700 may further comprise forming a photoresist protective layer 218 on the cover ITO layer 216 in mesa region MR as shown in FIG. 8, at step S704. The finished ITO layer and ZnO doped ITO layer that are formed in step region SR may be etched and then removed at step S706, as shown in FIG. 9. The photoresist protective layer 218 formed in step region SR may then be removed using a photoresist stripping solution at step S708, as shown in FIG. 10. The method may further comprise depositing conductive material on the surface of the cover ITO layer 216 in the mesa region MR to form a positive electrode 220, and on the surface of the n-type nitride layer 204 in the step region SR to form a negative electrode 222 at step S710. The conductive material may comprise at least one of chromium (Cr)/platinum (Pt)/gold (Au)/nickel (Ni)/gold (Au), and titanium (Ti)/aluminum (Al)/titanium (Ti)/gold (Au).

Figure 12:
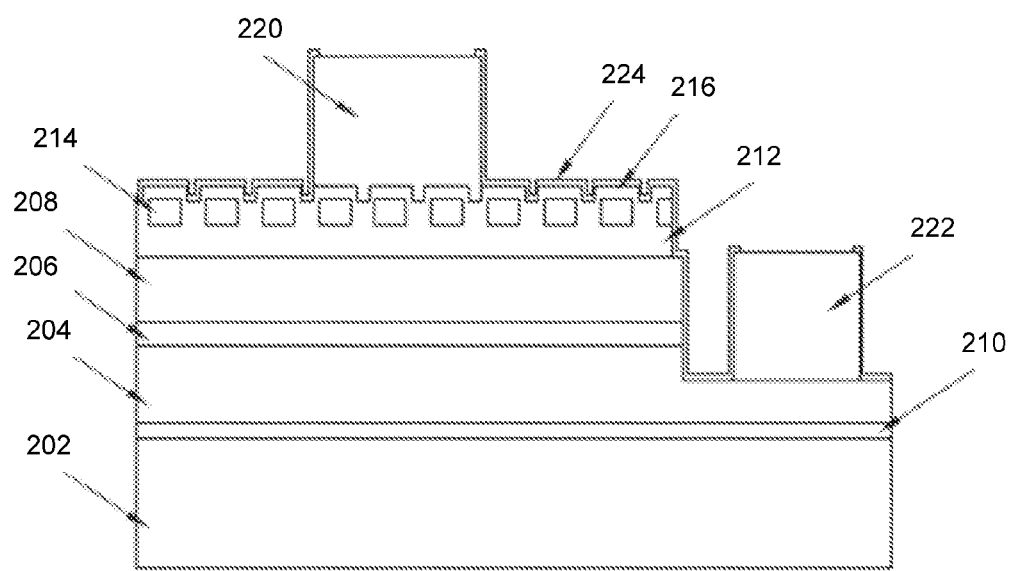
FIG. 12 illustrates a cross-sectional view of forming a passivation layer according to exemplary embodiments of the disclosure.

The method may further comprise depositing a passivation layer 224 without covering at least one surface of the positive electrode 220 and without covering at least one surface of the negative electrode 222, such as a surface of a top wall or a surface of a sidewall. As illustrated in FIG. 12, a surface of the top wall of the positive electrode 220 and a surface of the top wall of the negative electrode 222 are uncovered by the passivation layer 224. The passivation layer 224 may comprise at least one of oxide, nitride, and silicate. Oxide may be one of silicon dioxide ($SiO_2$), titanium dioxide ($TiO_2$), zirconium dioxide ($ZrO_2$), and silicon oxide ($Si_xO_y$). Silicates may be one of phosphorous acid (PSG), borosilicate (BSG), or boron phosphorus silicate (BPSG). Nitride may be one of silicon nitride ($Si_3N_4$), boron nitride (BN), or aluminum nitride (AlN).

The ZnO source material may comprise at least one of In doped ZnO, Ga doped ZnO, and aluminum doped ZnO and a mixture of Indium oxide and ZnO. Because the conductivity of one of the ZnO source material is similar to the conductivity of ITO, when a current diffusion layer is formed from ITO and the ZnO source material, the current may diffuse uniformly. The ZnO source material and ITO are both transparent compounds. So the refractive index of the ZnO source material and the refractive index of ITO are approximate. For example, the refractive index of the ZnO source material is about 2.0. Light may not be easily refracted when penetrating through the ITO layer 216 and the ZnO doped ITO layer, thus reducing the loss of light.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A method for forming a current diffusion layer in a light emitting diode device, the method comprising:
providing an epitaxial wafer, the epitaxial wafer comprising a substrate, an n-type nitride layer formed on the substrate, a light emitting diode layer formed on the n-type nitride layer, and a p-type nitride layer formed on the light emitting diode layer;
depositing ITO source material on the epitaxial wafer to form a base ITO layer by a direct current electron gun;
depositing ZnO source material, during simultaneous deposition of the ITO source material, on the base ITO layer to form a ZnO doped ITO layer by a pulse current electron gun, the ZnO source material being deposited at a deposition rate higher than the rate at which the ITO source material is deposited, generation and termination of current being controlled by adjusting duty cycle of pulse current provided by the pulse current electron gun and resulting in discontinuous deposition of the ZnO source material; and
depositing the ITO source material on the ZnO doped ITO layer to cover the ZnO doped ITO layer and form a finished ITO layer, wherein the finished ITO layer has a desired thickness and wherein a thickness of the base ITO layer is 85%-90% of that of the finished ITO layer.

2. The method of claim 1, further comprising forming a photoresist protective layer on a surface of the epitaxial wafer.

3. The method of claim 2, further comprising selectively removing material of the p-type nitride layer, the light emitting diode layer, and the n-type nitride layer to expose part of the n-type nitride layer.

4. The method of claim 2, further comprising removing the photoresist protective layer by a photoresist stripping solution to form a step region on the n-type nitride layer and a mesa region on the p-type nitride layer.

5. The method of claim 1, wherein the desired thickness of the finished ITO layer is from 250 nanometers to 260 nanometers.

6. The method of claim 1, wherein the duty cycle of pulse current is from 20% to 30%.

7. The method of claim 1, wherein the thickness of the doped ZnO layer is between 10 nanometers and 15 nanometers.

8. The method of claim 1, comprising depositing ITO source material on the epitaxial wafer by the direct current electron gun at a deposition rate between 0.5 Å/s and 1.2 Å/s.

9. The method of claim 1, comprising depositing ZnO source material on the base ITO layer by the pulse current electron gun at a deposition rate between 20 Å/s and 30 Å/s.

10. The method of claim 1, wherein the ZnO source material comprises at least one of In doped ZnO, Ga doped ZnO, aluminum doped ZnO, and a mixture of In oxide and ZnO.

11. The method of claim 1, wherein depositing the ITO source material on the ZnO doped ITO layer forms a cover ITO layer to cover the ZnO doped ITO layer, wherein the thickness of the cover ITO layer is between 15 nanometers and 20 nanometers.

12. A method for fabricating a light emitting diode device, comprising:
providing a current diffusion layer, the current diffusion layer formed by a method comprising:
providing an epitaxial wafer, the epitaxial wafer comprising a substrate, an n-type nitride layer formed on the substrate, a light emitting diode layer formed on the n-type nitride layer, and a p-type nitride layer formed on the light emitting diode layer;
depositing ITO source material on the epitaxial wafer to form a base ITO layer by a direct current electron gun;
depositing ZnO source material, during simultaneous deposition of the ITO source material, on the base ITO layer to form a ZnO doped ITO layer by a pulse current electron gun, the ZnO source material being deposited at a deposition rate higher than the rate at which the ITO source material is deposited, generation and termination of current being controlled by adjusting duty cycle of pulse current provided by the pulse current electron gun and resulting in discontinuous deposition of the ZnO source material; and
depositing the ITO source material on the ZnO doped ITO layer to cover the ZnO doped ITO layer and form a finished ITO layer;
the current diffusion layer having a step region formed on a n-type nitride layer and a mesa region on surface of the current diffusion layer;
forming a photoresist protective layer on the finished ITO layer to cover the mesa region;
removing the finished ITO layer and the ZnO doped ITO layer from the step region;
removing the photoresist protective layer; and
depositing conductive material on surface of the cover ITO layer in the mesa region to form a positive electrode and on surface of the n-type nitride layer in the step region to form a negative electrode.

13. The method of claim 12, further comprising removing the photoresist protective layer using a photoresist stripping solution.

14. The method of claim 12, further comprising depositing a passivation layer without covering at least one surface of the positive electrode and at least one surface of the negative electrode.

* * * * *